United States Patent [19]

Nakashiba

[11] Patent Number: 5,399,888
[45] Date of Patent: Mar. 21, 1995

[54] PHOTO-SHIELD STRUCTURE OF CHARGE-COUPLED DEVICE

[75] Inventor: Yasutaka Nakashiba, Tokyo, Japan

[73] Assignee: NEC Corporation, Japan

[21] Appl. No.: 36,924

[22] Filed: Mar. 25, 1993

[30] Foreign Application Priority Data

Mar. 27, 1992 [JP] Japan .................. 4-071017

[51] Int. Cl.$^6$ .................. H01L 29/796; H01L 27/14; H01L 31/00
[52] U.S. Cl. .................. 257/233; 257/250; 257/435
[58] Field of Search .................. 257/232, 233, 250, 249, 257/435

[56] References Cited

U.S. PATENT DOCUMENTS

| | | | |
|---|---|---|---|
| 5,250,825 | 10/1993 | Negishi et al. | 257/232 |
| 5,255,099 | 10/1993 | Orihara | 257/249 |
| 5,256,890 | 10/1993 | Furukawa et al. | 257/435 |
| 5,256,891 | 10/1993 | Losee et al. | 257/233 |

OTHER PUBLICATIONS

"A Frame Interline Transfer CCD Image Sensor for HDTV Camera System", ISSCC Digest of Technical Papers, pp. 88–89, 301 Feb. 1989.

Primary Examiner—Gene M. Munson
Attorney, Agent, or Firm—Laff, Whitesel, Conte & Saret, Ltd.

[57] ABSTRACT

A charge-coupled device has a metal wiring which serves both as a wiring for supplying a predetermined potential to charge transfer electrodes constituting a vertical charge transfer section and as a photo-shield for the vertical charge transfer section. The metal wiring is formed from a metal film, a refractory metal film or its silicides. The device has a photoelectric conversion section arranged in a two dimensional form and having a vertical bordering region at which the width of the metal wiring is wider than that of other regions. It is possible to suppress the generation of the false signal caused by smear phenomena without suffering from the lowering of the sensitivity of the device.

5 Claims, 2 Drawing Sheets

PHOTO-SHIELD STRUCTURE OF CHARGE-COUPLED DEVICE

BACKGROUND OF THE INVENTION

1. Field of the Invention

The present invention relates to a charge-coupled device (hereinafter referred to as "CCD"), and more particularly to a charge-coupled device having at its cell section a photo-shield structure in which a metal wiring formed from a metal film, a refractory metal film or its silicides serves both as wiring for supplying a predetermined potential to charge transfer electrodes constituting a vertical charge transfer section and as a photo-shield for the vertical charge transfer section.

2. Description of the Related Art

The CCD is superior to conventional and generally used image tubes in terms of the size, weight, durability, image residue and burning and, in the field of compact home video cameras, the image tube has already been taken over by the CCD. This trend is also true in the field of industrial cameras in which image sizes are comparatively large.

In the CCD with a comparatively large image size (for example, 1 inch or ⅔ inches), the typical example being that for a high-definition television (HDTV) system, there is a problem with the method for supplying drive pulses from two sides of an image region to a polysilicon transfer electrode. This problem is that, since the polysilicon charge transfer electrode has high resistance and large capacitance, the amplitude of the drive pulses is markedly reduced and the maximum transfer charge amount is reduced at a center portion of the image region especially when the transfer speed becomes high.

With a view to overcome the above problem, there has been proposed "A Frame Interline Transfer CCD Image Sensor for HDTV Camera System" in ISSCC Digest of Technical Papers, pp 88–89, February 1989, in which the metal wiring for supplying drive pulses to the charge transfer electrode constituting the vertical charge transfer section also functions as light-shields or photo-shields for the vertical charge transfer section.

FIG. 1 shows in plan view a portion of the image region of a four-phase CCD used in the above described conventional technique.

First and second vertical charge transfer electrodes 2 and 3 formed from polysilicon and constituting the vertical charge transfer section are connected at a cycle of four picture elements through contact holes 4 with the metal wirings 5 serving also as photo-shields, whereby the wiring resistance of the first and the second vertical charge transfer electrodes 2 and 3 can be made relatively low and the lowering of the amplitude of the drive pulses can be suppressed.

However, in the conventional CCDs having a structure in which a metal wiring formed from a metal film, a refractory metal film or its silicides serves both as wiring for supplying a predetermined potential to charge transfer electrodes constituting the vertical charge transfer section and as a photo-shield for the vertical charge transfer section, the photo-shielding characteristic at a vertical bordering region of a photoelectric conversion section 1 or at a section neighboring such region is poor. Therefore, the signal electron or charge excited by the light incident to such region at a deeper layer section of the photoelectric conversion section 1 in an inactive region or a region neighboring such region leaks into the vertical charge transfer section so that the false signal caused by "smear phenomena" increases and the image signal deteriorates.

If an attempt is made to overcome the above problem by narrowing the spacing between the wirings/photo-shields for the vertical charge transfer section, the sensitivity of the device deteriorates by a proportion inverse to this spacing. This is a problem to be solved by the invention, in the conventional photo-shield structure of the charge-coupled device.

SUMMARY OF THE INVENTION

It is, therefore, an object of the present invention to overcome the problems existing in conventional charge-coupled device and to provide a device in which it is possible to suppress the false signal caused by "smear phenomena" without suffering from the lowering of the sensitivity of the device.

According to one aspect of the invention, there is provided a charge-coupled device in which a metal wiring formed from a metal film, a refractory metal film or its silicides serves both as a wiring for supplying a predetermined potential to charge transfer electrodes constituting the vertical charge transfer section and as a photo-shield for the vertical charge transfer section, comprising a photoelectric conversion section arranged in a two dimensional form, the photoelectric conversion section having a vertical bordering region at which the width of the metal wiring is wider than that of other remaining regions.

The photoelectric conversion section of the metal wiring serving both as the wiring and the photo-shield is preferably in a polygonal shape or in a circular shape covering or partly covering all four corners of the photoelectric conversion section.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Now, referring to the accompanying drawings, a description will be given of the preferred embodiments according to the present invention.

Figure 2:
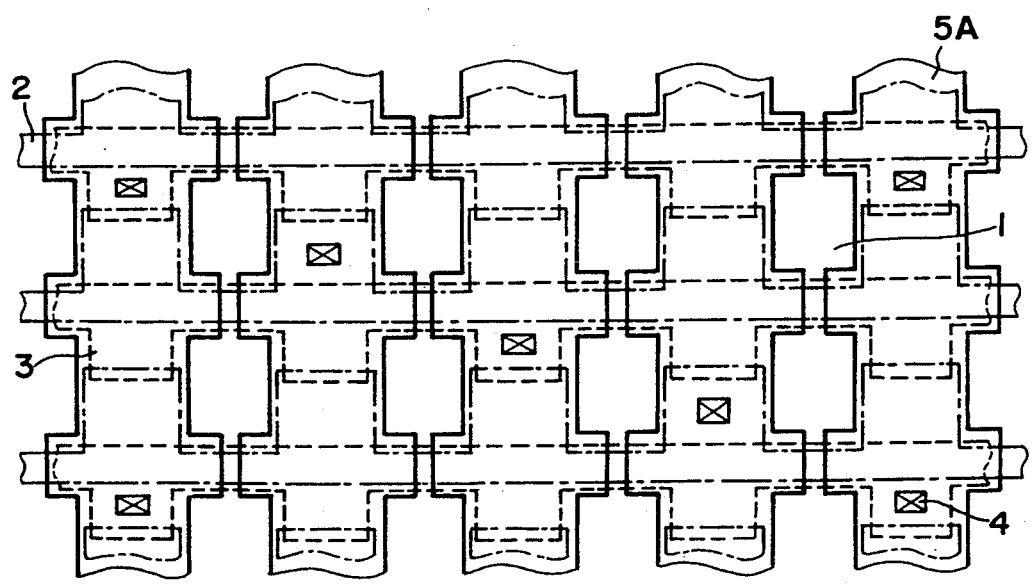
FIG. 2 is a plan view showing the cell section of the CCD of a first embodiment according to the invention.
Figure 3:
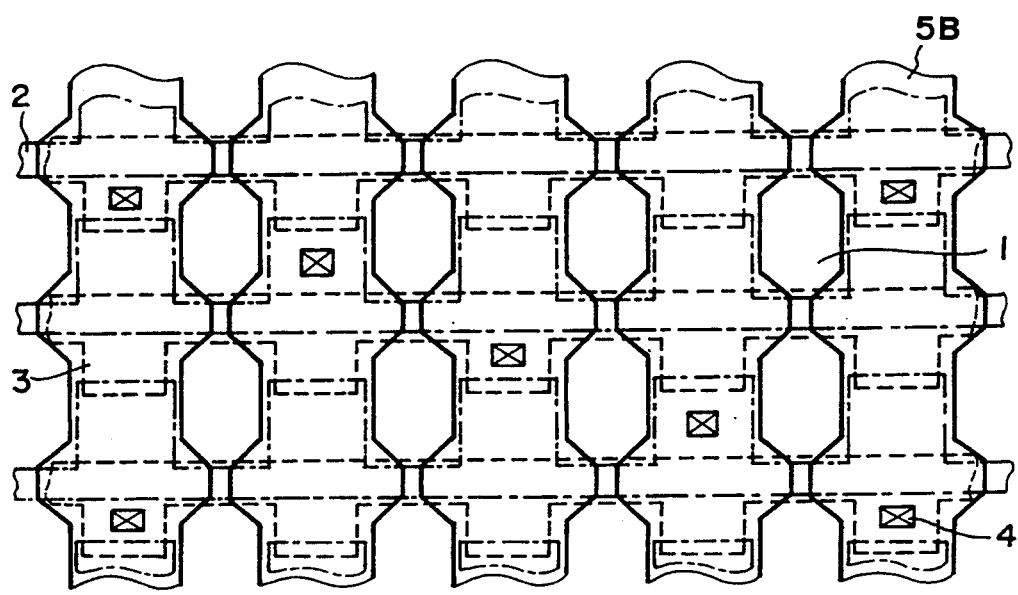
FIG. 3 is a plan view showing the cell section of the CCD of a second embodiment according to the invention.
Figure 4:
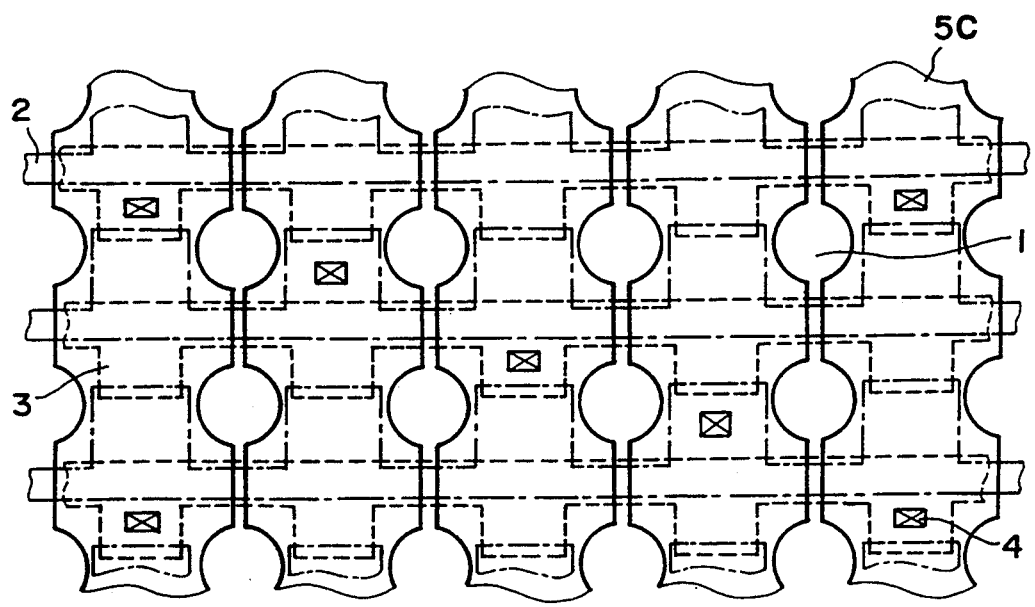
FIG. 4 is a plan view showing the cell section of the CCD of a third embodiment according to the invention.

FIGS. 2–4 are plan views showing the wirings/photo-shield films of a cell section of the CCD according to embodiments of the invention.

Figure 1:
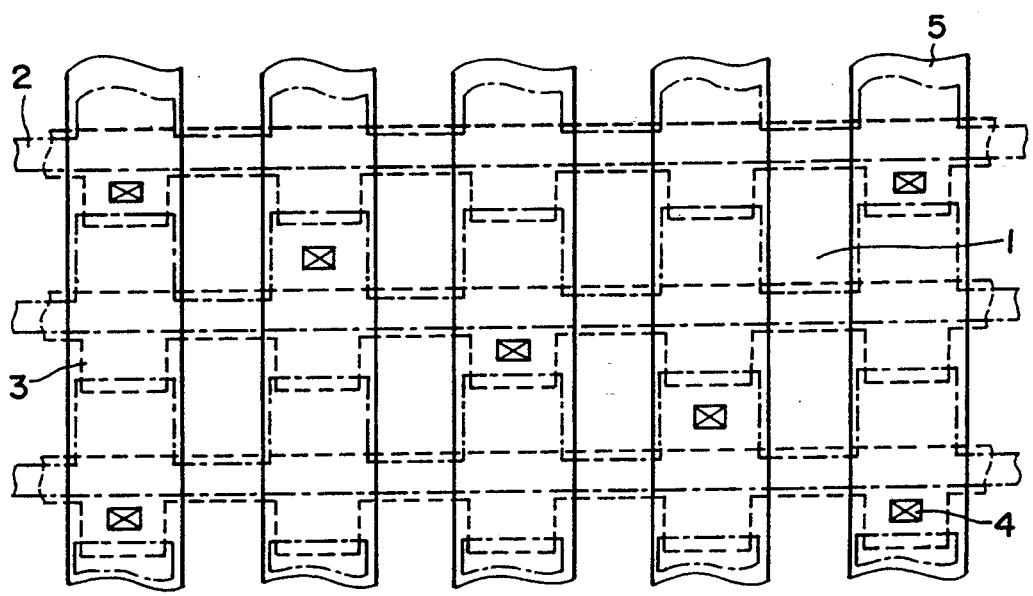
FIG. 1 is a plan view showing the cell section of a prior art CCD.

In FIGS. 2–4, the elements which are the same or similar to those of the prior art shown in FIG. 1 are given the same numerals and their descriptions are not repeated.

FIG. 2 shows a first embodiment in which the wirings/photo-shield films 5A according to the invention is applied to the same cell section as that of the prior art shown in FIG. 1.

In this first embodiment, since the wiring width at the vertical bordering region of the photoelectric conversion section 1 which region is an inactive region and is disposed in a two dimensional form is wider than other regions, it is possible to suppress the false signals or "smear phenomena" which develop when the charge excited by the light incident to the region concerned at a deep layer portion of the photoelectric conversion section 1 at the inactive region or a region neighboring thereto leaks into the vertical charge transfer section. This can be done without lowering the sensitivity of the device to any large extent.

FIG. 3 shows a second embodiment in which the wirings/photo-shield films 5B according to the invention is applied to the same cell section as that of the prior art shown in FIG. 1.

In this second embodiment, since the wiring width at the vertical bordering region of the photoelectric conversion section 1 which region is an inactive region and is disposed in two dimensions is wider than other regions and, moreover, the opening shape defined by the wirings/photo-shield films 5B at the photoelectric conversion section is polygonal covering or partly covering all four corners of the photoelectric conversion section 1, it is also possible to suppress the false signals caused by "smear phenomena" which develop when the charge excited by the light incident to the region concerned at a deep layer portion of the photoelectric conversion section 1 at the inactive region or a region neighboring thereto leaks into the vertical charge transfer section. This can be achieved without deteriorating the sensitivity of the device to any large extent.

FIG. 4 shows a third embodiment in which the wirings/photo-shield films 5C according to the invention is applied to the same cell section as that of the prior art shown in FIG. 1.

In this third embodiment, too, since the wiring width at the vertical bordering region of the photoelectric conversion section 1 which region is an inactive region and is disposed in two dimensions is wider than other regions and, moreover, the opening shape defined by the wirings/photo-shields 5C at the photoelectric conversion section is circular covering all four corners or partly of the photoelectric conversion section 1, it is possible to suppress the false signals or "smear phenomena" which develop when the charge excited by the light incident to the region concerned at a deep layer portion of the photoelectric conversion section 1 at the inactive region or a region neighboring thereto leaks into the vertical charge transfer section. This can be done without lowering the sensitivity of the device to any large extent.

As explained above, according to the invention, in the CCD having a structure in which a metal wiring formed from a metal film, a refractory metal film or its silicides serves both as a wiring for supplying a predetermined potential to charge transfer electrodes constituting the vertical charge transfer section and as a photo-shield for the vertical charge transfer section, since the wiring width at the vertical bordering region of the photoelectric conversion section 1 which region is an inactive region and is formed in two dimensions is wider than other remaining regions, it is possible to suppress to a large extent the generation of the false signal caused by smear phenomena without suffering from any significant lowering of the sensitivity of the device.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A charge-coupled device having a plurality of picture elements, said charge-coupled device comprising:
    a plurality of first and second charge transfer electrodes constituting a plurality of vertical charge transfer sections;
    a plurality of photoelectric conversion sections each defined by said first and second charge transfer electrodes in a two dimensional form; and
    a plurality of metal wirings serving both as a plurality of wirings for supplying a plurality of different drive pulses to said plurality of first and second charge transfer electrodes, respectively, and as photo-shields for said plurality of vertical charge transfer sections, each of said metal wirings being formed from a metal film, a refractory metal film or its silicides, and each of said metal wirings having a predetermined width which is increased in width at a vertical border region formed by said first and second charge transfer electrodes between adjacent picture elements.

2. A charge-coupled device according to claim 1, wherein each of said plurality of photoelectric conversion sections have four corners, said metal wirings which are disposed adjacent to each other define an opening having a polygonal shape covering or partly covering all four corners of each of said plurality of photoelectric conversion sections.

3. A charge-coupled device according to claim 2, wherein said polygonal shape is a rectangular shape.

4. A charge-coupled device according to claim 1, wherein each of said plurality of photoelectric conversion sections have four corners, said metal wirings which are disposed adjacent to each other define an opening having a circular shape covering or partly covering all four corners of each of said plurality of photoelectric conversion sections.

5. A charge-coupled device according to claim 1, wherein said first and second charge transfer electrodes are respectively connected with said metal wirings through contact holes at a cycle of a predetermined number of picture elements.

* * * * *